(12) United States Patent  
Seto

(10) Patent No.: US 7,259,455 B2
(45) Date of Patent: Aug. 21, 2007

(54) SEMICONDUCTOR DEVICE

(75) Inventor: Masaharu Seto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 11/075,420

(22) Filed: Mar. 9, 2005

(65) Prior Publication Data
US 2005/0200022 A1 Sep. 15, 2005

(30) Foreign Application Priority Data
Mar. 9, 2004 (JP) ............................. 2004-066113

(51) Int. Cl.
*H01L 23/12* (2006.01)
*H01L 23/28* (2006.01)
*H01L 23/29* (2006.01)
*H01L 21/00* (2006.01)

(52) U.S. Cl. ..................... 257/700; 257/787; 257/788; 257/E23.194; 438/106; 438/128

(58) Field of Classification Search ............... 257/700, 257/787, E23.116, E23.135, E23.194, E23.133, 257/788, 789, 790; 438/125, 105, 106, 126
See application file for complete search history.

(56) References Cited

U.S. PATENT DOCUMENTS 5,737,191 A 4/1998 Horiuchi et al.
6,680,524 B2 1/2004 Minamio et al.
6,777,816 B2 * 8/2004 Kazama et al. ............. 257/779
6,822,323 B1 * 11/2004 Kim et al. ................... 257/700
2005/0145994 A1 * 7/2005 Edelstein et al. ........... 257/642

FOREIGN PATENT DOCUMENTS

JP 09-246464 9/1997

OTHER PUBLICATIONS

Hasunuma, M. et al., "Semiconductor Device", U.S. Appl. No. 10/975,071, filed Oct. 28, 2004.

* cited by examiner

*Primary Examiner*—Long K. Tran
(74) *Attorney, Agent, or Firm*—Finnegan, Henderson, Farabow, Garrett & Dunner, L.L.P.

(57) ABSTRACT

There is provided a semiconductor device including a semiconductor chip which includes a semiconductor substrate and a multilayer interconnection structure formed thereon, the multilayer interconnection structure including an interlayer insulating film smaller in relative dielectric constant than an $SiO_2$ film, an encapsulating resin layer which covers a major surface of the semiconductor chip on a side of the multilayer interconnection structure and covers a side surface of the semiconductor chip, and a stress relaxing resin layer which is interposed between the semiconductor chip and the encapsulating resin layer, covers at least a part of an edge of the semiconductor chip on the side of the multilayer interconnection structure, and is smaller in Young's modulus than the encapsulating resin layer.

16 Claims, 4 Drawing Sheets

SEMICONDUCTOR DEVICE

CROSS-REFERENCE TO RELATED APPLICATIONS

This application is based upon and claims the benefit of priority from prior Japanese Patent Application No. 2004-066113, filed Mar. 9, 2004, the entire contents of which are incorporated herein by reference.

BACKGROUND OF THE INVENTION

1. Field of the Invention

The present invention relates to a semiconductor device and, more particularly, to a semiconductor device having a structure in which a semiconductor chip is covered with an encapsulating resin layer.

2. Description of the Related Art

Semiconductor devices such as a large-scale integrated circuit (LSI) are required to have high speed. To meet this requirement, it is recently being attempted to use low-resistivity materials as wires and decrease the relative dielectric constant of an interlayer insulating film. More specifically, the wiring material is being changed from Al to Cu. Also, as an interlayer insulating film, it is being considered to use a so-called "low-k film", such as a fluorine-doped $SiO_2$ film or an $SiO_2$ film containing an organic component, which has a relative dielectric constant smaller than that of a dense and pure $SiO_2$ film. Note that "an interlayer insulating film having a relative dielectric constant smaller than that of an $SiO_2$ film" used in this specification and in the scope of claims means "a low-k film".

The relative dielectric constant of an interlayer insulating film can be decreased by making the density of the film lower than the intrinsic density of the material, or by eliminating the dielectric polarization in the material.

For example, a low-density insulating film is generally obtained by making the material porous. The relative dielectric constant of an insulating film thus obtained is made smaller than the intrinsic relative dielectric constant of the material by pores in the insulating film. Unfortunately, these porous insulating films generally have low mechanical strength.

In addition, an insulating film from which the dielectric polarization is eliminated has low adhesion to another insulating film. That is, in a structure in which a plurality of interlayer insulating films including an interlayer insulating film having a low relative dielectric constant are stacked, peeling readily occurs at the interfaces between the insulating films.

The low mechanical strength and low adhesion of an interlayer insulating film pose problems such as film peeling in steps in which heating is performed. Examples are packaging of a semiconductor chip including a multilayer interconnection structure, mounting the obtained semiconductor package on a printed wiring board, and a temperature cycling test (TCT). This is so because in these heating steps, a thermal stress caused by a difference in coefficient of linear expansion between a semiconductor substrate and an encapsulating resin layer is applied to the multilayer interconnection structure to destroy or peel an interlayer insulating film.

Jpn. Pat. Appln. KOKAI Publication No. 9-246464 describes a semiconductor package in which a semiconductor chip is mounted on a wiring substrate via insulating resin by flip chip bonding, and the obtained structure is encapsulated with an encapsulating resin. In this semiconductor package, the insulating resin covers the side surfaces of the semiconductor chip. Jpn. Pat. Appln. KOKAI Publication No. 9-246464 also describes that a resin having Young's modulus smaller than that of the encapsulating resin is used as the insulating resin. The invention described in Jpn. Pat. Appln. KOKAI Publication No. 9-246464 can prevent, by the use of this structure, destruction of connecting portions occurring between the semiconductor chip and wiring substrate owing to, e.g., the thermal stress of the encapsulating resin.

BRIEF SUMMARY OF THE INVENTION

According to a first aspect of the present invention, there is provided a semiconductor device comprising a semiconductor chip which comprises a semiconductor substrate and a multilayer interconnection structure formed thereon, the multilayer interconnection structure including an interlayer insulating film smaller in relative dielectric constant than an $SiO_2$ film, an encapsulating resin layer which covers a first major surface of the semiconductor chip on a side of the multilayer interconnection structure and covers a side surface of the semiconductor chip, and a stress relaxing resin layer which is interposed between the semiconductor chip and the encapsulating resin layer, covers at least a part of an edge of the semiconductor chip on the side of the multilayer interconnection structure, and is smaller in Young's modulus than the encapsulating resin layer.

According to a second aspect of the present invention, there is provided a semiconductor assembly comprising a wiring substrate, a semiconductor chip which comprises a semiconductor substrate and a multilayer interconnection structure formed thereon and is disposed such that the semiconductor substrate is interposed between the multilayer interconnection structure and the wiring substrate, the multilayer interconnection structure including an interlayer insulating film smaller in relative dielectric constant than an $SiO_2$ film, a mounting material which is interposed between the semiconductor chip and the wiring substrate and fixes the semiconductor chip on the wiring substrate, an encapsulating resin layer which covers the semiconductor chip fixed on the wiring substrate, and a stress relaxing resin layer which is interposed between the semiconductor chip and the encapsulating resin layer, covers at least a part of an edge of the semiconductor chip on a side of the multilayer interconnection structure, and is smaller in Young's modulus than the encapsulating resin layer.

DETAILED DESCRIPTION OF THE INVENTION

Figure 1:
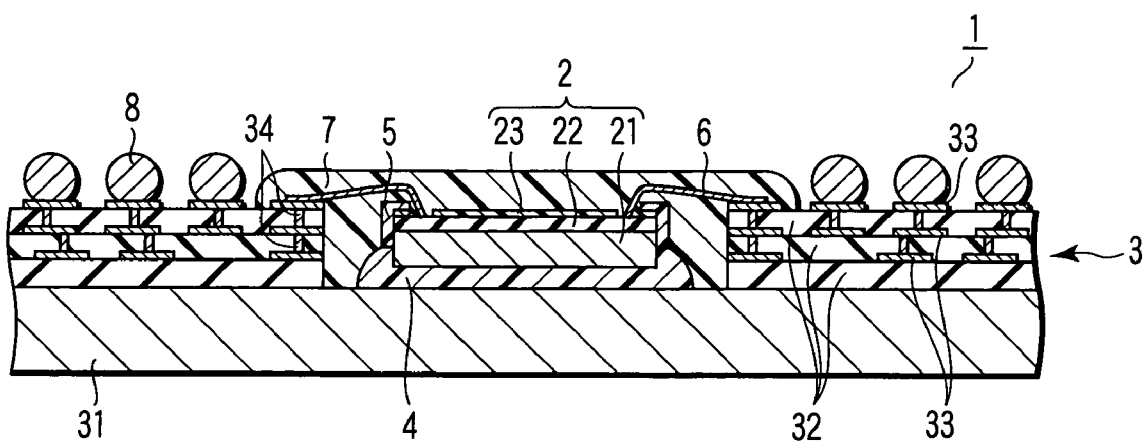
FIG. 1 is a sectional view schematically showing a semiconductor device according to the first embodiment of the present invention.

Embodiments of the present invention will be described below with reference to the accompanying drawings. In the drawings, the same reference numerals denote components having the same or similar functions, and a repetitive explanation thereof will be omitted.

Figure 2:
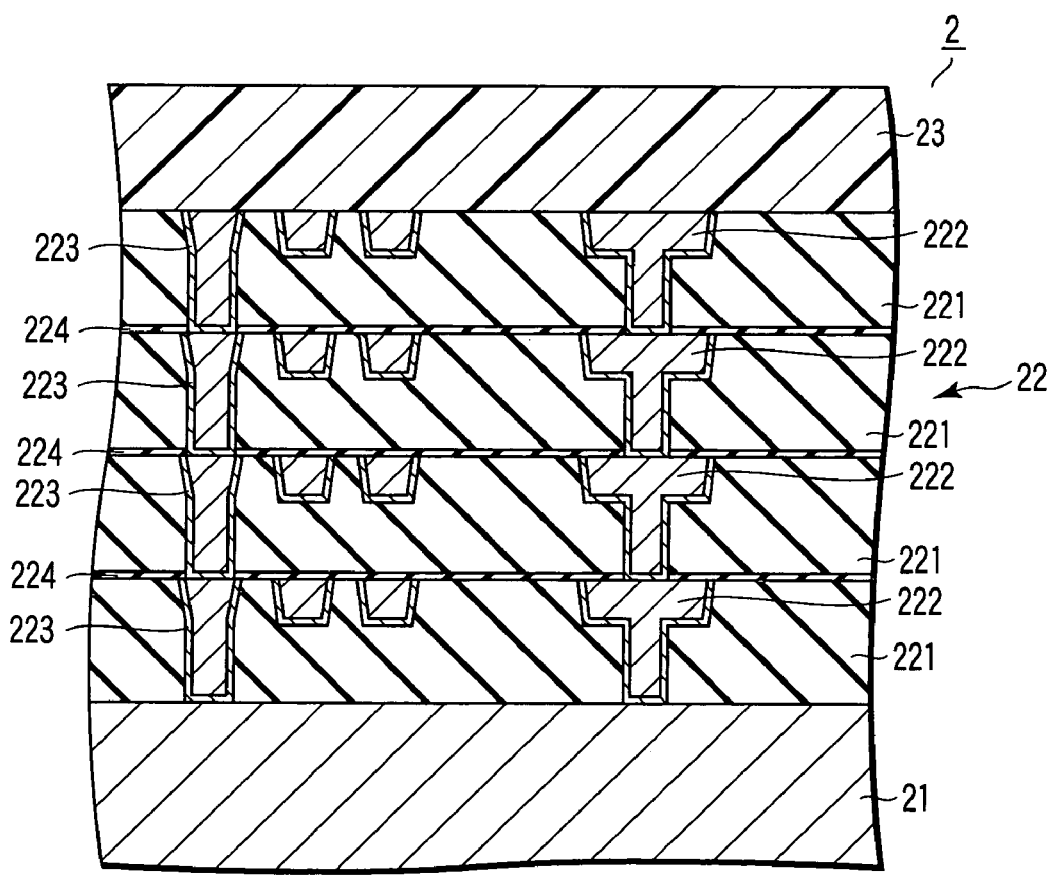
FIG. 2 is a sectional view schematically showing an example of a semiconductor chip usable in the semiconductor device shown in FIG. 1.

FIG. 1 is a sectional view schematically showing a semiconductor device according to the first embodiment of the present invention. FIG. 2 is a sectional view schematically showing an example of a semiconductor chip usable in the semiconductor device shown in FIG. 1.

The semiconductor device 1 shown in FIG. 1 is a semiconductor package called an enhanced ball grid array (EBGA). The semiconductor package 1 includes a semiconductor chip 2, a wiring substrate 3, a mounting material 4, a stress relaxing resin layer 5, bonding wires 6, a resin encapsulating layer 7, and metal bumps 8.

The semiconductor chip 2 includes a semiconductor substrate 21 such as a silicon substrate. Various elements such as transistors are formed on one major surface of the semiconductor substrate 21.

A multilayer interconnection structure 22 is formed on this major surface of the semiconductor substrate 21. The multilayer interconnection structure 22 includes a plurality of interlayer insulating films 221 and a plurality of wiring layers 222. The interlayer insulating films 221 and the wiring layers 222 are alternately stacked on the abovementioned major surface of the semiconductor substrate 21. Plugs buried in through holes of the interlayer insulating films 221 connect wires included in the wiring layers 222 adjacent to each other, and also connect wires included in the lowermost wiring layer 222 and the various elements formed on the major surface of the semiconductor substrate 21.

At least one of the interlayer insulating films 221, and typically all the interlayer insulating films 221 are low-k films. A low-k film is an insulating film having a relative dielectric constant smaller than that of a dense and pure $SiO_2$ film. For example, the low-k film has a relative dielectric constant of less than 2.8. Examples of the low-k film usable as the interlayer insulating film 221 are films having siloxane skeletons such as polysiloxane, hydrogen silosesquioxane, polymethylsiloxane, and methylsilosesquioxane, films mainly containing organic resin such as polyarylene ether, polybenzoxazole, and polybenzocyclobutene, and porous films such as a porous silica film, porous methylsilosesquioxane film (porous MSQ film), porous polyarylene ether film (porous PAE film), and porous hydrogen silosesquioxane (porous HSQ film). An example of the material of the wiring layers 222 is Cu.

Note that in the semiconductor chip 2 shown in FIG. 2, the multilayer interconnection structure 22 is formed by dual damascene. That is, recesses such as through holes and trenches are formed in each interlayer insulating film 221 and filled with the wiring layer 222, thereby forming plugs and wires. Also, in the semiconductor chip 2 shown in FIG. 2, barrier layers 223 are interposed between the interlayer insulating films 221 and the wiring layers 222, and cap layers 224 made of, e.g., SiCN are interposed between the interlayer insulating films 221 adjacent to each other.

A buffer coating layer 23 containing resin is formed on the multilayer interconnection structure 22. The buffer coating layer 23 covers the major surface of the multilayer interconnection structure 22. Through holes are formed in the buffer coating layer 23 at positions corresponding to portions to be used as pads of the uppermost wiring layer 222. Young's modulus of the buffer coating layer 23 is smaller than that of the encapsulating resin layer 7. Young's modulus at room temperature of the buffer coating layer 23 can be, e.g., 2 GPa or less, and 1 GPa or less. As the material of the buffer coating layer 23, it is possible to use an organic polymer such as polyimide resin, elastomer, norbornene-based resin, silicone-based resin, novolak-based resin, or epoxy-based resin. The thickness of the buffer coating layer 23 can be, e.g., about 2.5 to 3 µm.

The wiring substrate 3 is called an interposer, and includes a support 31, insulating layers 32, conductor patterns 33 used as wires and pads, and connecting conductors 34. The insulating layers 32 and the conductor patterns 33 are alternately stacked on the support 31, thereby forming a multilayer interconnection structure. Through holes are formed in the insulating layers 32 and filled with the connecting conductors 34. The conductor patterns 33 adjacent to each other are connected by the connecting conductors 34.

As the material of the support 31, it is possible to use, e.g., a material having high thermal conductivity such as a metal material. Polyimide layers or the like can be used as the insulating layers 32, and copper or the like can be used as the material of the conductor patterns 33. Also, copper, solder, or the like can be used as the material of the connecting conductors 34.

In a substantially central portions of the insulating layers 32 and the conductor patterns 33, an opening having a size larger than the semiconductor chip 2 and a shape which is typically a rectangle is formed. The major surface of the semiconductor chip 2 which is opposite to its major surface on the side of the multilayer interconnection structure 22 faces the support 31, and the semiconductor chip 2 is fixed on the surface of the support 31 exposed at the opening by the mounting material 4.

In this embodiment, the wiring substrate 3 including the multilayer interconnection structure is explained as an example. However, the wiring substrate 3 need not always include a multilayer interconnection structure. That is, it is also possible to use a structure in which one insulating layer 32 and one conductor pattern 33 are sequentially stacked on a support 31.

The support 31 may be made of a resin, silicon, etc. In this case, conductor plugs which extend through the support 31 and a conductor pattern to be used as pads on the back side of the support 31 may be formed.

The mounting material 4 is interposed between the semiconductor chip 2 and wiring substrate 3, and covers portions of the side surfaces of the semiconductor chips 2 on the side of the wiring substrate 3. The mounting material 4 can be formed by using die bonding paste containing a resin such as epoxy resin, a curing agent such as an amine-based curing agent, and a filler such as alumina.

The stress relaxing resin layer 5 covers at least portions of the edges of the semiconductor chip 2 on the side of the multilayer interconnection structure 22. As an example, the stress relaxing resin layer 5 covers all the edges of the semiconductor chip 2 on the side of the multilayer interconnection structure 22. That is, the stress relaxing resin layer 5 covers the periphery of the major surface of the semiconductor chip 2 on the side of the multilayer interconnection structure 22, and also covers portions of the side surfaces of the semiconductor chip 2 on the side of the multilayer interconnection structure 22. Those portions of the stress relaxing resin layer 5 which cover the side surfaces of the semiconductor chip 2 extend across the boundary between the multilayer interconnection structure 22 and semiconductor substrate 21. Also, those portions of the stress relaxing resin layer 5 which cover the side surfaces of the semiconductor chip 2 are in contact with those portions of the mounting material 4 which cover the side surfaces of the semiconductor chip 2.

Young's modulus of the stress relaxing resin layer 5 is smaller than that of the encapsulating resin layer 7. Young's modulus at room temperature of the stress relaxing resin layer 5 is, e.g., 2 GPa or less, and typically, 1 GPa or less. As the material of the stress relaxing resin layer 5, it is possible to use an organic polymer such as polyimide resin, elastomer, norbornene-based resin, silicone-based resin, novolak-based resin, or epoxy-based resin. The materials of the stress relaxing resin layer 5 and buffer coating layer 23 can be the same or different.

The bonding wires 6 connect the pads of the semiconductor chip 2 and the pads of the wiring substrate 3. Gold or the like can be used as the material of the bonding wires 6.

The encapsulating resin layer 7 covers the major surface of the semiconductor chip 2 on the side of the multilayer interconnection structure 22, covers the side surfaces of the semiconductor chip 2, and buries the bonding wires 6. The encapsulating resin layer 7 can be formed by using, e.g., chip coating paste containing a resin such as epoxy resin, a curing agent such as an amine-based or acid-anhydride-based curing agent, a filler such as silica, and, if necessary, an additive such as a coupling agent. Note that the coefficient of linear expansion of the encapsulating resin layer 7 is typically one or more orders of magnitude larger than that of the semiconductor substrate 21.

The metal bumps 8 are arranged on the uppermost conductor patterns 33. The metal bumps 8 are used to connect the semiconductor package 1 to a printed wiring board (not shown). Solder balls or the like can be used as the metal bumps 8.

Peeling caused by the stress of the encapsulating resin layer 7 mainly occurs from the edges of the semiconductor chip 2 on the side of the multilayer interconnection structure 22. To prevent this peeling, therefore, it is important to prevent the stress of the encapsulating resin layer 7 from acting on these edges.

In this embodiment as described above, the edges of the semiconductor chip 2 on the side of the multilayer interconnection structure are covered with the stress relaxing resin layer 5. Also, in this embodiment, the stress relaxing resin layer 5 has Young's modulus smaller than that of the encapsulating resin layer 7. This makes it possible to prevent the stress of the encapsulating resin layer 7 from acting on the edges of the semiconductor chip 2 on the side of the multilayer interconnection structure 22. Accordingly, this embodiment can prevent film peeling caused by the stress of the encapsulating resin layer 7.

Note that film peeling caused by the stress of the encapsulating resin layer 7 primarily occurs from the four corners of the semiconductor chip 2. Therefore, when only portions of the edges of the semiconductor chip 2 on the side of the multilayer interconnection structure 22 are to be covered with the stress relaxing resin layer 5, the stress relaxing resin layer 5 may be formed to cover the four corners of the semiconductor chip 2 on the side of the multilayer interconnection structure 22.

The semiconductor package 1 described above can be fabricated by, e.g., the following method.

FIGS. 3 to 8 are sectional views schematically showing an example of a method of fabricating the semiconductor device according to the first embodiment of the present invention.

Figure 3:
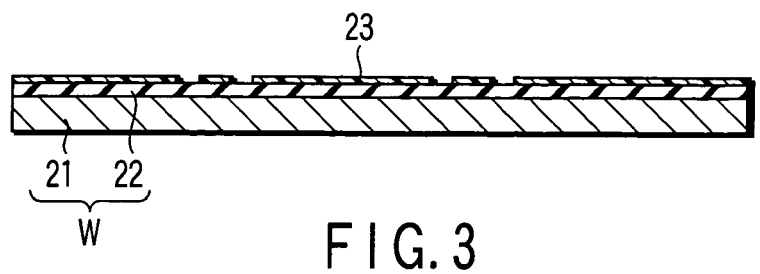
FIGS. 3 to 8 are sectional views schematically showing an example of a method of fabricating the semiconductor device according to the first embodiment of the present invention.

In this method, as shown in FIG. 3, a buffer coating layer 23 is first formed on that surface of a semiconductor wafer W on which a multilayer interconnection structure 22 is formed. Through holes are formed in the buffer coating layer 23 at positions corresponding to pads of each semiconductor chip 2. The buffer coating layer 23 can be formed by using, e.g., photolithography.

Figure 4:
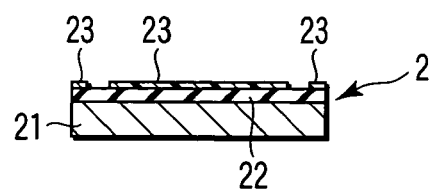
Figure 5:
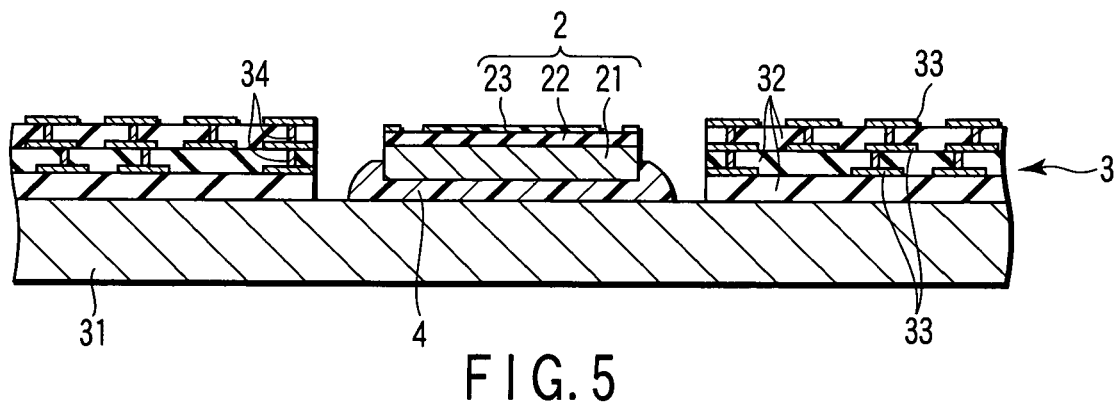

Then, the semiconductor wafer W is diced. Consequently, as shown in FIG. 4, a plurality of semiconductor chips 2 each having the buffer coating layer 23 are obtained.

Die bonding paste or the like is dispensed on the surface of a support 31 at the position of an opening formed in insulating layers 32 and semiconductor patterns 33 of a wiring substrate 3. Subsequently, the semiconductor chip 2 is arranged on the die bonding paste such that the back surface of the semiconductor chip 2 which is opposite to its major surface on the side of the multilayer interconnection structure 22 faces the support 31. The die bonding paste is then thermally hardened to obtain a structure shown in FIG. 5.

Figure 6:
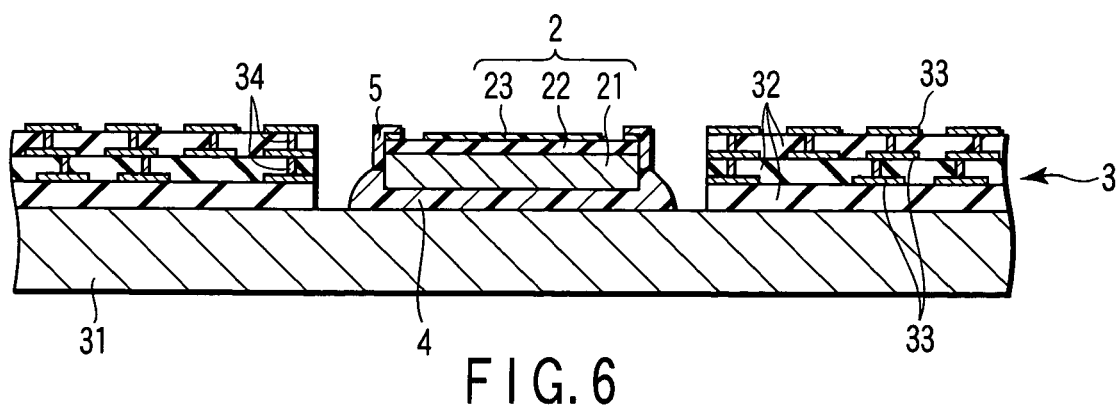

After that, as shown in FIG. 6, a stress relaxing resin layer 5 which covers the edges of the semiconductor chip 2 on the side of the multilayer interconnection structure 22 is formed. The stress relaxing resin layer 5 can be formed by coating portions corresponding to the stress relaxing resin layer 5 with resin paste by screen printing, and thermally hardening the obtained coating film. Alternatively, the stress relaxing resin layer 5 can be formed by coating portions corresponding to the stress relaxing resin layer 5 with resin paste by dispensing, and thermally hardening the obtained coating film.

Figure 7:
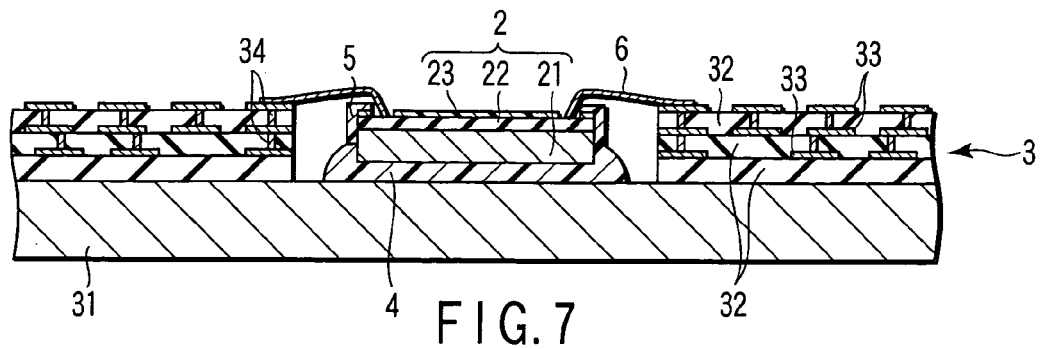

As shown in FIG. 7, pads of the semiconductor chip 2 and pads of the wiring substrate 3 are connected by bonding wires 6.

Figure 8:
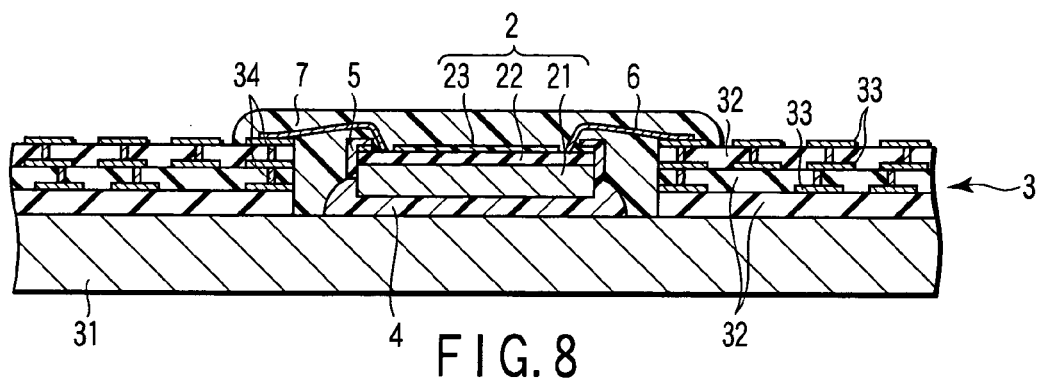

After that, chip coating paste or the like is dispensed on the wiring substrate 3 to cover the upper surface and side surfaces of the semiconductor chip 2 and bury the bonding wires 6. An encapsulating resin layer 7 shown in FIG. 8 is obtained by thermally hardening the obtained coating film.

Furthermore, metal bumps 8 are arranged on the uppermost conductor patterns 33. In this manner, the semiconductor package 1 shown in FIG. 1 is obtained.

The second embodiment of the present invention will be described below.

Figure 9:
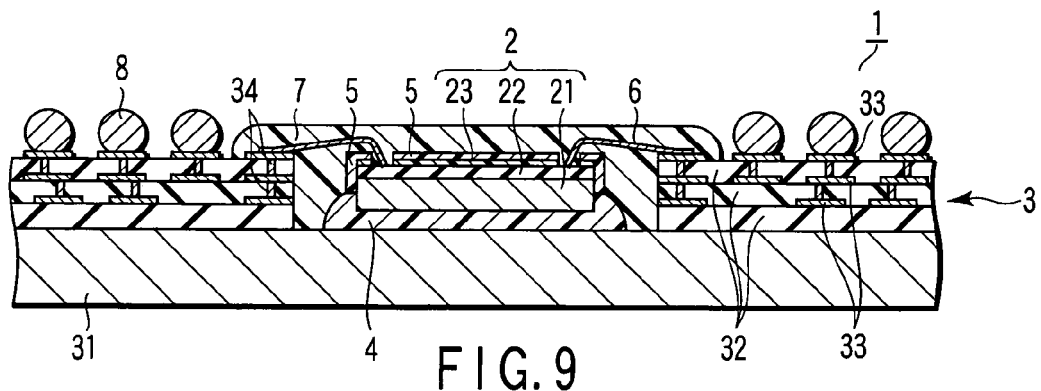
FIG. 9 is a sectional view schematically showing a semiconductor device according to the second embodiment of the present invention.

FIG. 9 is a sectional view schematically showing a semiconductor device according to the second embodiment of the present invention. A semiconductor device 1 has the same structure as the semiconductor package 1 according to the first embodiment except that a stress relaxing resin layer 5 covers the edges of a semiconductor chip 2 on the side of a multilayer interconnection structure 22 and covers a central portion of the major surface of the semiconductor chip 2 on the side of the multilayer interconnection structure 22. When this structure is used, the same effects as explained in the first embodiment can be obtained.

Also, in the semiconductor package 1 shown in FIG. 9, the stress relaxing resin layer 5 covers the central portion of the major surface of the semiconductor chip 2 on the side of the multilayer interconnection structure 22. When this structure is used, a larger amount of material is necessary to form the stress relaxing resin layer 5. However, when compared to the semiconductor package 1 of the first embodiment, this structure increases the effect of preventing the stress of an encapsulating resin layer 7 from acting on the central portion of the major surface of the semiconductor chip 2 on the side of the multilayer interconnection structure 22.

The third embodiment of the present invention will be described below.

Figure 10:
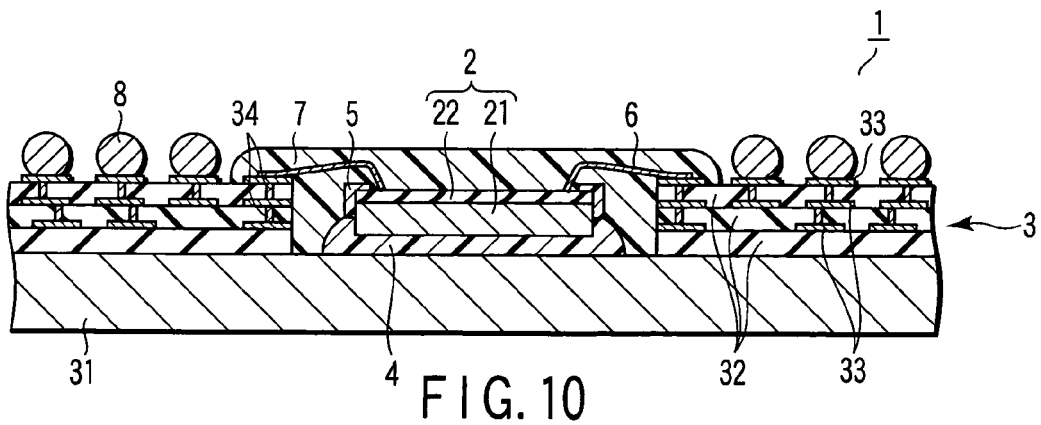
FIG. 10 is a sectional view schematically showing a semiconductor device according to the third embodiment of the present invention.

FIG. 10 is a sectional view schematically showing a semiconductor device according to the third embodiment of the present invention. A semiconductor device 1 has the same structure as the semiconductor package 1 according to the first embodiment except that the buffer coating layer 23 is omitted. When this structure is used, almost the same effects as explained in the first embodiment can be obtained.

Since the buffer coating layer 23 is omitted from the semiconductor package 1 shown in FIG. 10, a stress larger than that in the semiconductor package 1 of the first embodiment acts on a central portion of the major surface of the semiconductor chip 2 on the side of the multilayer interconnection structure 22. However, the semiconductor package 1 shown in FIG. 10 is more advantageous in reducing the fabrication cost than the semiconductor package 1 of the first embodiment.

The fourth embodiment of the present invention will be described below.

Figure 11:
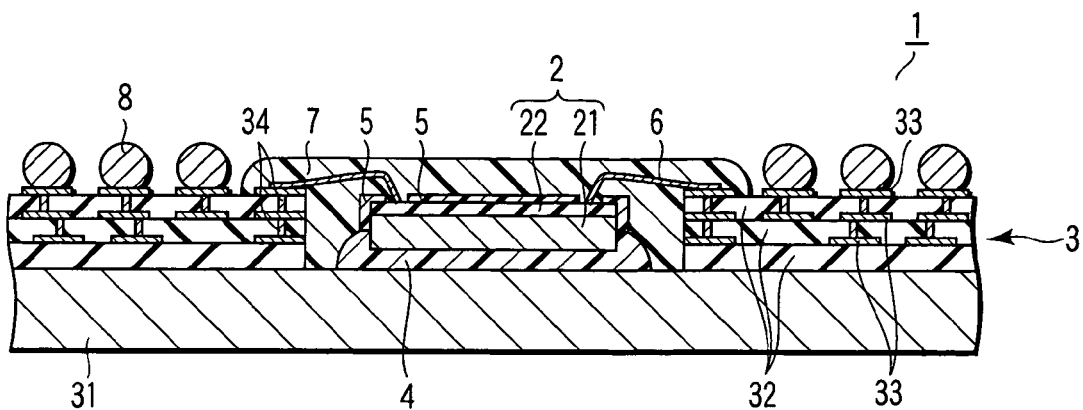
FIG. 11 is a sectional view schematically showing a semiconductor device according to the fourth embodiment of the present invention.

FIG. 11 is a sectional view schematically showing a semiconductor device according to the fourth embodiment of the present invention. A semiconductor device 1 has the same structure as the semiconductor package 1 according to the second embodiment except that the buffer coating layer 23 is omitted. When this structure is used, almost the same effects as explained in the second embodiment can be obtained.

Since the buffer coating layer 23 is omitted from the semiconductor package 1 shown in FIG. 11, a stress larger than that in the semiconductor package 1 of the second embodiment acts on a central portion of the major surface of a semiconductor chip 2 on the side of a multilayer interconnection structure 22. However, the semiconductor package 1 shown in FIG. 11 is more advantageous in reducing the fabrication cost than the semiconductor package 1 of the second embodiment.

In each of the above embodiments, the present invention is applied to an EBGA. However, the present invention is also applicable to a BGA other than the EBGA. Examples are a plastic ball grid array (PBGA), plastic fine pitch ball grid array (PFBGA), tape ball grid array (TBGA), and flip chip ball grid array (FCBGA). When the semiconductor chip 2 is to be bonded on the wiring substrate 3 by flip chip bonding, the edges of the semiconductor chip 2 on the side of the multilayer interconnection structure are usually covered with the stress relaxing resin layer 5 before flip chip bonding.

In addition, although the present invention is applied to a BGA in each of the above embodiments, the present invention is also applicable to a semiconductor package, such as a quad flat package (QFP) and chip scale package (CSP), other than the BGA.

Furthermore, in each of the above embodiments, the wiring substrate 3 is used as an interposer. However, the wiring substrate 3 may also be a printed circuit board. That is, the semiconductor chip 2 may be mounted on a printed circuit board by chip on board (COB) mounting. In other words, the present invention can also be applied to a semiconductor assembly such as a semiconductor module.

Examples of the present invention will be described below.

First, a TCT was conducted on the semiconductor package 1 shown in FIG. 1.

In this TCT, the same material was used as the buffer coating layer 23 and stress relaxing resin layer 5. The thickness of the buffer coating layer 23 was 5 μm, and that of the stress relaxing resin layer 5 was 10 μm. A silicon substrate was used as the semiconductor substrate 21. A low-dielectric-constant oxide film containing Si, O, C, and H and having a relative dielectric constant of about 2.2 was used as the interlayer insulating film 221. Also, the encapsulating resin layer 7 was formed to have a thickness of about 150 μm by using chip coating paste containing epoxy resin as its main component. Young's modulus at room temperature of the encapsulating resin layer 7 was 10 GPa or more.

The TCT was conducted such that a temperature change from −55° C. to +125° C. was one cycle and the number of cycles was 500. For comparison, a TCT was conducted under the same conditions as above on a semiconductor package 1 having the same structure as above except that no stress relaxing resin layer 5 was formed. The results are shown in Table 1 below.

TABLE 1

| | Stress relaxing resin layer | Buffer coating layer | Peeling ratio |
| --- | --- | --- | --- |
| | Material/Young's modulus at room temperature | | |
| Example 1 | Polyimide resin/3.0 GPa | | 0% (0/4) |
| Example 2 | Elastomer/1.0 GPa | | 0% (0/4) |
| Example 3 | Norbornene-based resin/0.3 GPa | | 0% (0/4) |
| Comparative example | — | Polyimide resin/3.0 GPa | 100% (4/4) |

As shown in Table 1, film peeling occurred in all samples when no stress relaxing resin layer 5 was formed. More specifically, film peeling occurred before 100 cycles in all samples having no stress relaxing resin layer 5. In contrast, when the stress relaxing resin layer 5 was formed, it was possible to prevent film peeling in all samples.

Then, to check the relationship between Young's moduli of the buffer coating layer 23 and stress relaxing resin layer 5 and the liability to film peeling, a modified edge lift-off test (m-ELT) was conducted by the following method.

Figure 12:
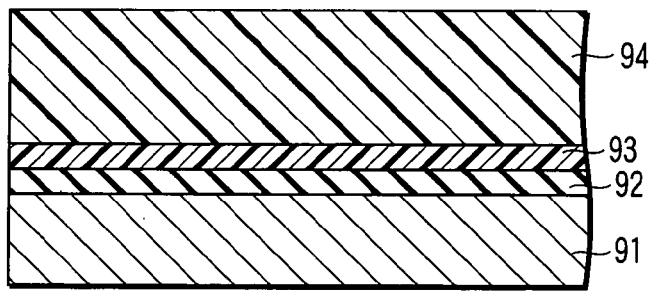
FIG. 12 is a sectional view schematically showing a sample used in an m-ELT.

FIG. 12 is a sectional view schematically showing a sample used in the m-ELT. As shown in FIG. 12, this sample used in the m-ELT had a structure in which a multilayer interconnection structure 92, first resin layer 93, and second resin layer 94 were sequentially stacked on a silicon substrate 91. The layer arrangement and the material of each layer of the multilayer interconnection structure 92 were the same as those of the multilayer interconnection structure 22 of the semiconductor package 1 used in the TCT. The thickness of the first resin layer 93 was 8 μm. Also, the thickness of material of the second resin layer 94 was the same as those of the encapsulating resin layer 7 of the semiconductor package 1 used in the TCT.

Each sample was gradually cooled from room temperature, and the temperature at which film peeling occurred was recorded. From this temperature, a stress $K_{app}$ when film peeling occurred was calculated. Note that in a sample using norbornene-based resin as the first resin layer 93, no film peeling occurred even when the temperature reached the limit (0.5 MPa as the value of the stress $K_{app}$) of the apparatus used. The results of the m-ELT are shown in Table 2 below and in FIG. 13.

TABLE 2

| | First resin layer Material/Young's modulus at room temperature | $K_{app}$ |
|---|---|---|
| Example 4 | Polyimide resin/ 3.0 GPa | About 0.3 MPa |
| Example 5 | Elastomer/1.0 GPa | About 0.45 MPa |
| Example 6 | Norbornene-based resin/0.3 GPa | More than 0.5 MPa (Exceeded detection limit) |

Figure 13:
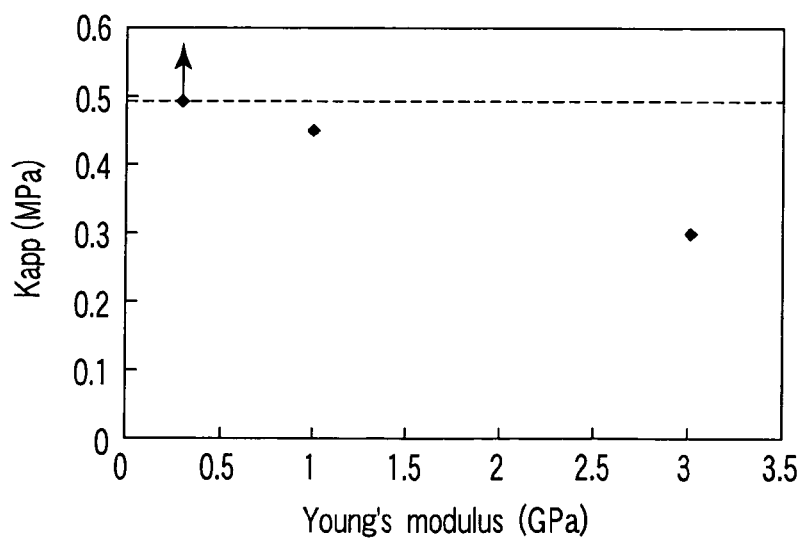
FIG. 13 is a graph showing the results of the m-ELT.

FIG. 13 is a graph showing the results of the m-ELT. Referring to FIG. 13, the abscissa indicates Young's modulus at room temperature of the first resin layer 93, and the ordinate indicates the stress $K_{app}$ when film peeling occurred.

As shown in Table 2 and FIG. 13, the smaller the Young's modulus at room temperature of the first resin layer 93, the lower its liability to film peeling. This outcome indicates that in order to prevent film peeling, it is advantageous to use a resin layer having a small Young's modulus as the buffer coating layer 23 and/or the stress relaxing resin layer 5.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a semiconductor chip which comprises a semiconductor substrate and a multilayer interconnection structure formed thereon, the multilayer interconnection structure including an interlayer insulating film smaller in relative dielectric constant than an SiO2 film;
   an encapsulating resin layer which covers a first major surface of the semiconductor chip on a side of the multilayer interconnection structure and covers a side surface of the semiconductor chip; and
   a stress relaxing resin layer which is interposed between the semiconductor chip and the encapsulating resin layer, covers at least a part of an edge of the semiconductor chip on the side of the multilayer interconnection structure, and is smaller in Young's modulus than the encapsulating resin layer, the stress relaxing resin layer covering the first major surface only at a periphery thereof.

2. The device according to claim 1, wherein a part of the stress relaxing resin layer which covers the side surface of the semiconductor chip extends across a boundary between the multilayer interconnection structure and the semiconductor substrate.

3. The device according to claim 2, further comprising:
   a wiring substrate facing a second major surface of the semiconductor chip which is opposite to the first major surface; and
   a mounting material which is interposed between the semiconductor chip and the wiring substrate and fixes the semiconductor chip on the wiring substrate,
   wherein the mounting material covers a part of the side surface of the semiconductor chip on a side of the wiring substrate, and
   wherein the part of the stress relaxing resin layer which covers the side surface of the semiconductor chip is in contact with a part of the mounting material which covers the side surface of the semiconductor chip.

4. The device according to claim 1, wherein the semiconductor chip further comprises a buffer coating layer which contains a resin and covers a major surface of the multilayer interconnection structure.

5. The device according to claim 1, wherein the stress relaxing resin layer entirely covers the edge of the semiconductor chip on the side of the multilayer interconnection structure.

6. The device according to claim 1, wherein the stress relaxing resin layer covers a corner of the semiconductor chip on the side of the multilayer interconnection structure.

7. The device according to claim 1, wherein Young's modulus of the stress relaxing resin layer at room temperature is 2 GPa or less.

8. The device according to claim 1, further comprising a wiring substrate which supports the semiconductor chip.

9. The device according to claim 8, wherein a second major surface of the semiconductor chip which is opposite to the first major surface faces the wiring substrate.

10. The device according to claim 8, wherein the wiring substrate is an interposer.

11. A semiconductor assembly comprising:
    a wiring substrate;
    a semiconductor chip which comprises a semiconductor substrate and a multilayer interconnection structure formed thereon and is disposed such that the semiconductor substrate is interposed between the multilayer interconnection structure and the wiring substrate, the multilayer interconnection structure including an interlayer insulating film smaller in relative dielectric constant than an SiO2 film;
    a mounting material which is interposed between the semiconductor chip and the wiring substrate and fixes the semiconductor chip on the wiring substrate;
    an encapsulating resin layer which covers the semiconductor chip fixed on the wiring substrate; and
    a stress relaxing resin layer which is interposed between the semiconductor chip and the encapsulating resin layer, covers at least a part of an edge of the semiconductor chip on a side of the multilayer interconnection structure, and is smaller in Young's modulus than the encapsulating resin layer, the stress relaxing resin layer covering a major surface only at a periphery thereof.

12. The assembly according to claim 11, wherein a part of the stress relaxing resin layer which covers a side surface of the semiconductor chip extends across a boundary between the multilayer interconnection structure and the semiconductor substrate.

13. The assembly according to claim 12, wherein the mounting material covers a part of the side surface of the semiconductor chip on a side of the wiring substrate, and
    wherein the part of the stress relaxing resin layer which covers the side surface of the semiconductor chip is in contact with a part of the mounting material which covers the side surface of the semiconductor chip.

14. The assembly according to claim 11, wherein the semiconductor chip further comprises a buffer coating layer which contains a resin and covers a major surface of the multilayer interconnection structure.

15. The assembly according to claim 11, wherein the stress relaxing resin layer entirely covers the edge of the semiconductor chip on the side of the multilayer interconnection structure.

16. The assembly according to claim 11, wherein the stress relaxing resin layer covers a corner of the semiconductor chip on the side of the multilayer interconnection structure.

* * * * *

UNITED STATES PATENT AND TRADEMARK OFFICE
CERTIFICATE OF CORRECTION

PATENT NO. : 7,259,455 B2 Page 1 of 1
APPLICATION NO. : 11/075420
DATED : August 21, 2007
INVENTOR(S) : Seto It is certified that error appears in the above-identified patent and that said Letters Patent is hereby corrected as shown below:

Claim 1, column 9, line 43, change "SiO2" to --$SiO_2$--.

\* Claim 11, column 10, line 40, change "SiO2" to --$SiO_2$--.

Signed and Sealed this

Twentieth Day of November, 2007

JON W. DUDAS
*Director of the United States Patent and Trademark Office*